United States Patent [19]

DeFreitas

[11] 4,313,204
[45] Jan. 26, 1982

[54] DIGITAL ENCODING CIRCUITRY WITH MEANS TO REDUCE QUANTIZATION NOISE

[75] Inventor: Richard E. DeFreitas, Westford, Mass.

[73] Assignee: DeltaLab Research, Inc., Chelmsford, Mass.

[21] Appl. No.: 89,210

[22] Filed: Oct. 29, 1979

[51] Int. Cl.³ .......................................... H03K 13/22
[52] U.S. Cl. ................................... 375/28; 332/11 D; 375/26
[58] Field of Search ....................... 375/26, 33, 28, 60; 332/11 D

[56] References Cited

U.S. PATENT DOCUMENTS

| | | | |
|---|---|---|---|
| 3,746,990 | 7/1973 | LeDiberder et al. | 332/11 D |
| 3,896,399 | 7/1975 | McDonald | 332/11 D |
| 4,075,655 | 2/1978 | Iijima et al. | 375/33 |
| 4,190,801 | 2/1980 | DeFreitas | 332/11 D |

*Primary Examiner*—Glen R. Swann, III

[57] ABSTRACT

In an electrical system for generating a digitally-encoded signal from an analog signal and a reference signal, a circuit for reducing quantization noise comprises a bandpass filter which passes audible frequency components, the output of which filter is used to adjust the encode signal so as to reduce the level of audible components in a signal decoded from the encoded one.

20 Claims, 9 Drawing Figures

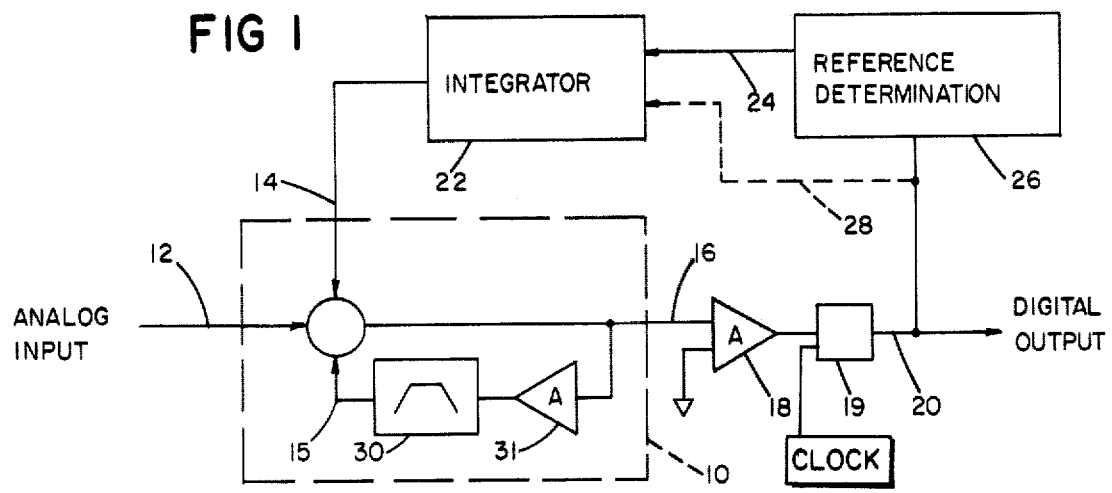
FIG 1
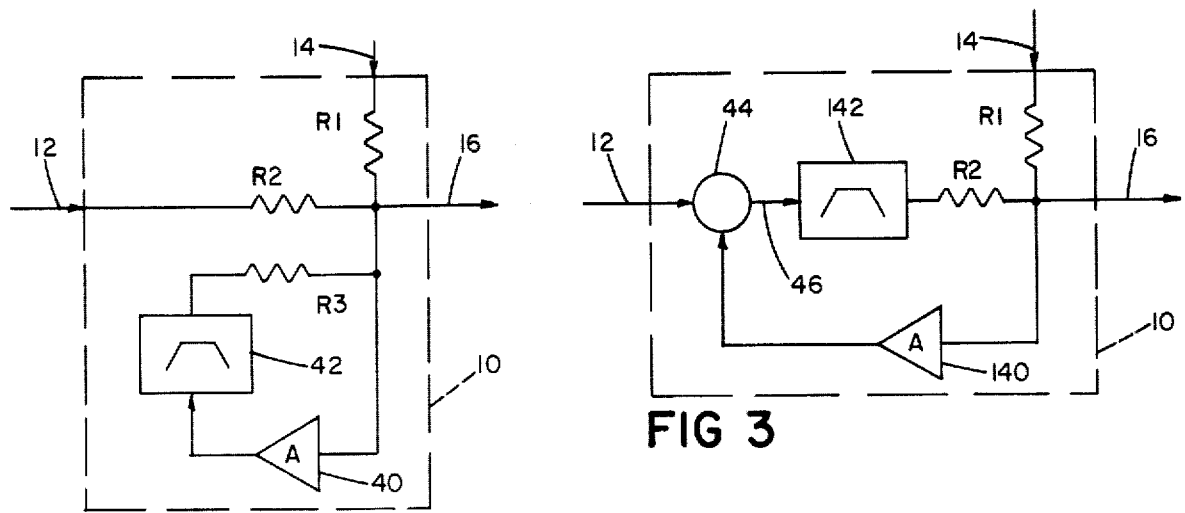
FIG 2
FIG 3
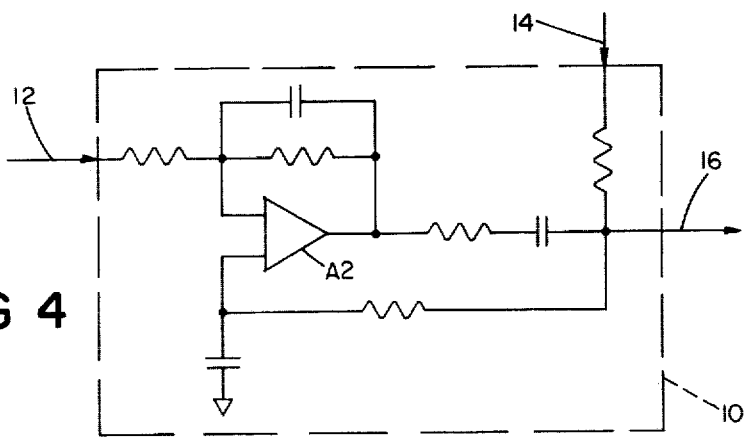
FIG 4
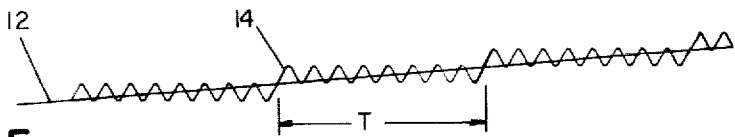
FIG 5

DIGITAL ENCODING CIRCUITRY WITH MEANS TO REDUCE QUANTIZATION NOISE

FIELD OF THE INVENTION

This invention relates to digitally encoding and decoding electrical signals.

BACKGROUND OF THE INVENTION

In delta modulating and other similar systems, the digitally-encoded signal stream (1's and 0's) represents the slope of each segment of the encoded analog signal. A digital 1 means the analog slope is positive, and the decoder reconstructs the analog signal by increasing it a predetermined amount. A digital 0 causes the decoder to decrease the analog signal by the same amount. The digital signal is arrived at by comparing the analog input signal with the reconstructed analog signal produced by decoding the digital signal. A 1 is generated if the input is less than the reconstructed signal, and a 0 if the input is greater. Typically, the difference between the input and reconstructed signals is first computed, and then the difference is applied to a comparator amplifier that generates a digital 1 if the difference is one polarity and a digital 0 if the other polarity.

The reconstructed analog signal is made up of a sequence of positively or negatively-sloped segments, and thus has a sawtooth appearance as compared to the smoother input signal. It is desirable, particularly in acoustic devices, to keep the sawtooth, or quantization, noise inaudible. Conventionally this has been approached by raising the frequency of the encoding clock high enough to place the frequency of the sawtooth outside the audible frequency range and by adjusting the segment slopes of the reconstructed signal so that they are about the same magnitude as the slope of the input.

SUMMARY OF THE INVENTION

I have found that even with the above approaches, there remain audible subharmonics in the quantization noise. The presence of this audible noise is the result of the decision process by which the encoder decides whether to encode a 1 or a 0. For example, to encode a slowly rising input signal, the encoder may generate a string of alternating 1's and 0's interspersed every so often with a repeat of two 1's. The repeat is needed to raise the level of the encoded signal. The period between successive repeats can be long enough to produce an audible noise artifact, often sounding like a shrill whistle. In the past, I have attempted to keep the frequency of this audible subharmonic intentionally high by reducing the period between repeats. I accomplished this by making the positive decoding slope slightly smaller or larger than the negative slope, thus forcing more repeats to occur to account for this slight built-in error. But this slope adjustment if carried too far can increase noise in other ways, and thus a careful, time-consuming, and expensive tuning procedure must be followed.

I have now found that these audible noise artifacts can be simply and inexpensively reduced by passing the difference between the input and reconstructed signals through an audio bandpass filter to produce a signal containing the audible components of the quantization noise, and using this audible component of noise to adjust the encoded signal so as to reduce the level of audible quantization noise in the reconstructed (decoded) signal. In effect, the invention alters the decision process of the encoder in such a way that audible quantization noise is greatly reduced.

In preferred embodiments, a bandpass filter is used to determine the audible component; the audible component is amplified and summed with the difference; the level of amplification is selected so as to reduce the level of audible quantization noise; the encoder includes circuitry for delta encoding, including a comparator, circuitry for determining a reference signal, and an integrator responsive to the reference signal for generating the decoded signal; a clock controls the encoder and has a frequency of at least 10 times the high frequency cutoff of the bandpass filter; the difference between the input and decoded signal is formed at the junction of a pair of resistors; a third resistor connected to the junction is used to combine the audible component with the difference; the three resistors have equal values and the audible component is amplified by a gain of 3; an amplifier and the bandpass filter are connected in a loop originating at the junction between resistors and terminating at the input end of the third resistor; and the clock frequency is at least 225 KHz.

PREFERRED EMBODIMENTS

The circuitry and operation of preferred embodiments of the invention will now be described, after first briefly describing the drawings.

DRAWINGS

FIG. 1 is a block diagram of an encoder embodying the invention.

FIG. 2 is a schematic of the summing circuitry of a most preferred embodiment.

FIGS. 3 and 4 are schematics of the summing circuitry of another preferred embodiment.

FIG. 5 is an example of a decoded analog signal with audible quantization noise.

CIRCUITRY

Figure 6:
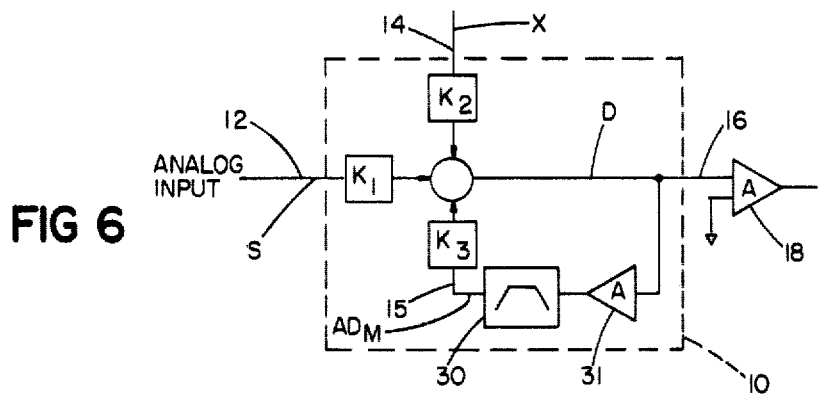
FIG. 6 is a block diagram of a portion of an encoder embodying the invention.

Referring to FIG. 1, there is shown a delta encoder. Summing and filtering circuitry 10 process analog input signal 12 and reconstructed analog signal 14. Output 16 of the summing circuitry is applied to the input of comparator 18. Flip-flop 19 produces digital output 20 from the comparator output. Reconstructed analog signal 14 is generated by integrator 22 in response to a reference signal 24 generated by block 26. The reference signal is representative of the derivative of the input, and is generated by processing the digital output 20. In some encoders, digital output 20 also switches the polarity of integrator 22, which accounts for connection 28 shown by a broken line.

Summing and filtering circuitry 10 computes the sum of input signal 12, reconstructed signal 14, and the output 15 of bandpass filter 30. Output 15 is derived by passing the summed output signal 16 through amplifier 31 and filter 30. The polarity of a signal 14 is opposite that of input 12, and thus summing the two signals computes the difference between them.

Referring to FIG. 2, there is shown the most preferred circuitry for block 10. Resistors $R_1$ and $R_2$ by themselves form a voltage divider that gives the sum of signals 12, 14. In the prior art (e.g., DeFreitas U.S. patent application Ser. No. 875,336, filed Feb. 6, 1978, now U.S. Pat. No. 4,190,801), only these two resistors were used. Loop 38, including amplifier 40, bandpass filter 42, and resistor $R_3$, have the effect of removing audible noise artifacts from reconstructed signal 14. $R_1$, $R_2$, and $R_3$ are equal, and amplifier 40 has a gain of 3.0. Bandpass filter 42 has cutoff frequencies at the low and high-frequency ends of the audible range (about 50 and 15,000 Hz).

Referring to FIG. 3, there is shown another preferred embodiment. Input signal 12 and the output of amplifier 140 are summed at summer 44, and the sum 46 is applied to bandpass filter 142 (identical in function to filter 42). The complete circuitry for amplifier 140 and filter 142 is shown in FIG. 4. Operational amplifier $A_2$ performs the functions of both amplifier 140 and filter 142.

OPERATION

In operation, analog input signal 12 is compared with the reconstructed (decoded) signal 14 at summing block 10, and the polarity of difference signal 16 determines whether a 1 or a 0 is encoded in the digital output. In a conventional delta encoder, the polarity of difference signal 16 (of block 10) would be determined exclusively by the polarity of the sum of input 12 and reconstructed signal 14. If the input were larger than the reconstructed signal, the polarity would be positive, and a digital 1 would be produced by flip-flop 19. Conversely, if the input were smaller than the reconstructed signal, the polarity would be negative, and a digital 0 would be produced.

This conventional decision process is altered by the incorporation of the loop containing filter 30. The decision of whether to encode a 1 or a 0 is dependent on the polarity of a combination of three signals: input signal 12, reconstructed signal 14, and audible noise signal 15. The presence of the last component can change the polarity of signal 16 and thus can change the pattern of 1's and 0's in the digital signal stream. Such a change occurs when the quantization noise (i.e., the pattern of triangles superimposed on the reconstructed signal) contains audible components (so-called audible subharmonics). In this event, filter 30 passes the audible portion of signal 16, producing signal 15, which is summed with the other two signals 12, 14, thereby changing signal 16 and in turn changing the digital signal produced by comparator 18 and flip-flop 19.

It is preferable that the lower cutoff frequency of filter 30 be sufficiently high so that the positive feedback loop formed by amplifier 31 and the filter does not cause the circuit to be unstable. The gain of amplifier 31 must also be kept below that level at which instability can occur. Filter 30 should also preferably have a high-frequency cutoff selected so that the clock frequency is at least fifteen times the high frequency cutoff. If the clock frequency is much lower, quantization noise can be increased. A clock frequency greater than ten times the high cutoff would, however, work reasonably well. To encode the full audio range, these limits require that the clock frequency should preferably be greater than 225 K Hz.

Even though the clock frequency is well above the audible range, audible noise components can be produced. For example, in FIG. 5 there is shown a slowly rising input signal 12. Superimposed on the input is the reconstructed signal 14 that would be produced without the invention: a string of alternating 1's and 0's interspersed every so often with a repeat of two 1's. The repeat is needed to raise the level of the encoded signal. The period T of the repeat can be long enough to produce an audible noise artifact.

With the invention, a different reconstructed signal 14 is produced than shown in FIG. 5. The period T of the noise harmonic is reduced sufficiently so as not to be audible.

A theoretical understanding of how the invention achieves a reduction in audible quantization noise can be had by considering the generalized schematic of FIG. 6, which shows comparator 18 and summing and filtering block 10, with scale factors $K_1$, $K_2$, $K_3$ multiplying signals 12, 14, 15, respectively. Input signal 12 and decoded signal 14 have been given the designations S and X, respectively. Signal 16, the output of the summer and input to the comparator, is denoted by D, which, in turn, has three components $D_L$, $D_M$, $D_H$ of low, middle, and high frequency, respectively. Only the middle component $D_M$ is audible, and only it passes through bandpass filter 30. Thus the following expression can be written:

$$K_1 S + K_2 X + K_3 A D_M = D = D_L + D_M + D_H$$

If A is set equal to $1/K_3$, the $D_M$ terms drop from each side of the equation, which can then be solved for X, the decoded signal:

$$X = -(K_1/K_2)S + (D_L/K_2) + (D_H/K_2)$$

And since $D_L$ and $D_H$ are outside the audible range, the decoded signal becomes a pure function of the input, without any audible noise.

$$X = -(K_1/K_2)S$$

If resistors $R_1$, $R_2$, and $R_3$ in FIG. 2 are equal, the scale factors $K_1$, $K_2$, $K_3$ turn out to be all equal to $\frac{1}{3}$. This explains the above mentioned preference of a gain of 3.0 ($1/K_3$) for amplifier 40.

Figure 8A:
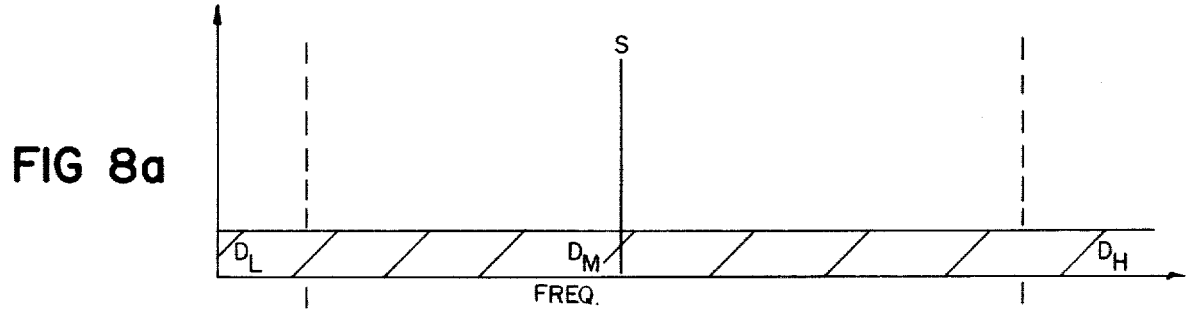
FIGS. 8a and 8b are plots of the approximate spectrums of the decoded signal with (8b) and without (8a) the invention (for a single tone input).
Figure 8B:
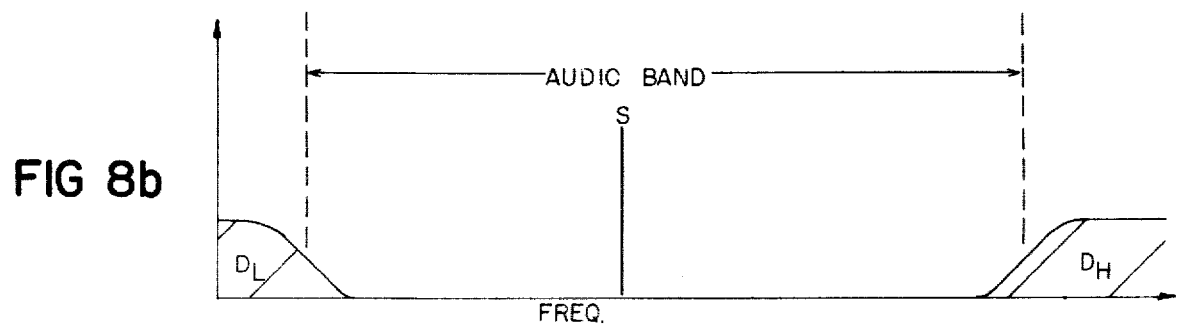

Turning to FIGS. 8a and 8b, there is shown the spectrum of decoded signal 14 for a single mid-frequency tone applied as input signal 12. Fig. 8a shows the spectrum without the invention; quantization noise is uniformly spread across the frequency range, and the single vertical line S represents the input tone. The result with the invention is shown in FIG. 8b; quantization noise is restricted to above and below the audible range.

Figure 7:
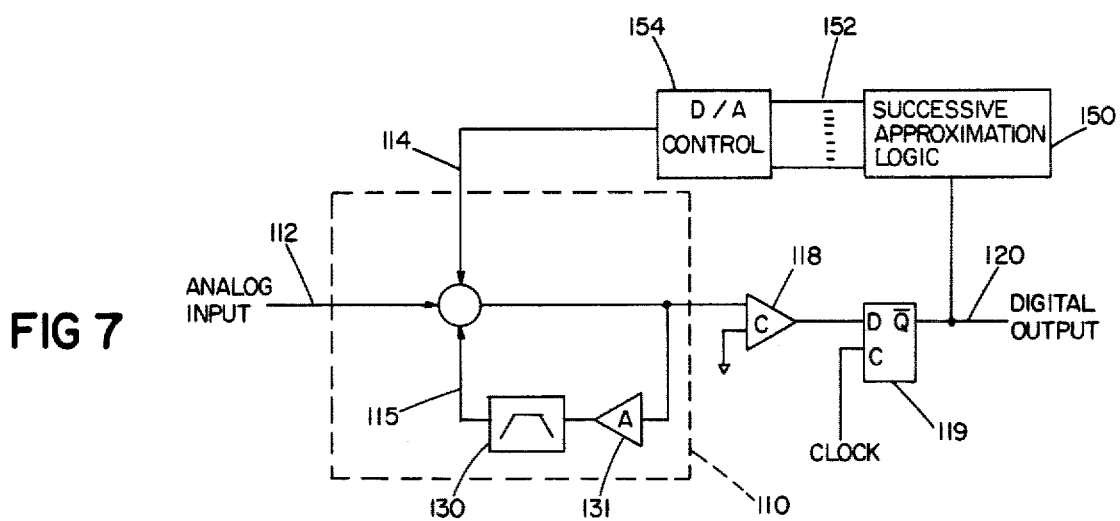
FIG. 7 is a block diagram of an alternative PCM embodiment of the invention.

Other embodiments of the invention are within the scope of the following claims. For example, the invention could be applied to differential PCM and ordinary PCM systems and to other analog-to-digital conversion systems of the type that compare a decoded feedback signal to the analog input. An example of the invention as applied to PCM encoding is given in FIG. 7. Summing and filtering block 110, filter 130, amplifier 131, comparator 118, and flip-flop 119 all function similarly to their counterparts in FIG. 1. Digital signal 120 is used by successive approximation logic 150 to determine digital output word 152. Digital-to-analog converter 154 decodes digital word 152 to generate decoded signal 114.

The disclosures of two copending applications are hereby incorporated by reference—Ser. No. 875,336, filed Feb. 6, 1978, now U.S. Pat. No. 4,190,801, by myself, and Ser. No. 71,244, filed Aug. 20, 1978, by DeFreitas and Blake.

What is claimed is:

1. In an electrical system for generating a digitally-encoded signal from an analog input signal, including comparator means for comparing said analog signal to a decoded signal determined by decoding said digitally-encoded signal, said comparator means including means for forming the difference between said analog and decoded signals, the improvement comprising means for reducing the audible component of the quantization noise in said decoded signal by modifying the audible frequency component of the analog input signal to said comparator means.

2. In an electrical system for generating a digitally-encoded signal from an analog input signal, including comparator means for comparing said analog signal to a decoded signal determined by decoding said digitally-encoded signal, said comparator means including means for forming the difference between said analog and decoded signals, the improvement comprising:
first means for determining the audible frequency component of said difference, and
second means for reducing the level of the audible frequency component of quantization noise in said decoded signal by adjusting said encoded signal in response to said audible component.

3. The improvement of claim 2 wherein said first means comprises a bandpass filter responsive to said difference between said input and decoded signals, the band of said filter being the audible frequency band.

4. The improvement of claim 3 wherein said second means includes means for amplifying said audible component and means for combining said amplified audible component with said difference, the level of amplification provided by said amplifying means being selected so as to reduce the level of audible quantization noise in said decoded signal.

5. The improvement of claim 4 wherein said electrical system includes means for delta encoding said analog signal, including
a second comparator means responsive to said difference,
a clock-controlled logic means for transforming the output of said second comparator means into said digitally-encoded signal, which consists of a pulse stream with high and low states,
means responsive to said pulse stream for producing a reference signal, and
integrator means responsive to said reference signal and pulse stream for generating said decoded signal by raising the level of said decoded signal in response to one of said states and lowering it in response to the other of said states.

6. The improvement of claim 5 including a clock for controlling said logic means, said clock having a frequency of a least 10 times the high-frequency cutoff of said bandpass filter.

7. The improvement of claim 5 wherein
said means for forming the difference between said input and decoded signals includes a pair of resistors, the junction of the two resistors being connected to the input of said second comparator means, the other ends of said resistors being connected to electrical leads carrying said analog and decoded signals, and
said decoded signal is of the opposite polarity to said analog signal so that the signal formed at said junction by said pair of resistors is said difference.

8. The improvement of claim 7 wherein
said means for combining said amplified audible component with said difference includes a third resistor connected at one end to said junction and
said means for amplifying and said bandpass filter are connected in a loop beginning at said junction and ending at the other end of said third resistor.

9. The improvement of claim 8 wherein said three resistors are of equal value and said means for amplifying has a gain of three.

10. The improvement of claim 7 wherein
said means for amplifying and said bandpass filter are connected in a loop originating at said junction and terminating at the input end of one of said resistors,
means for summing said analog signal with said difference signal, which is formed at said junction, are provided in said loop, and
the sum of said analog and difference signals is processed by said bandpass filter.

11. The improvement of claim 6 wherein said clock has a frequency of at least 15 times the high-frequency cutoff of said bandpass filter.

12. The improvement of claim 11 wherein said clock frequency is at least 225 K Hz.

13. The improvement of claim 1 wherein said electrical system includes means for delta encoding said analog signal, including
a second comparator means responsive to said difference,
a clock-controlled logic means for transforming the output of said second comparator means into said digitally-encoded signal, which consists of a pulse stream with high and low states,
means responsive to said pulse stream for producing a reference signal, and
integrator means responsive to said reference signal and pulse stream for generating said decoded signal by raising the level of said decoded signal in response to one of said states and lowering it in response to the other of said states.

14. The improvement of claim 13 including a clock for controlling said logic means, and wherein said means for reducing includes a bandpass filter, said clock having a frequency of at least 10 times the high-frequency cutoff of said bandpass filter.

15. The improvement of claim 13 wherein
said means for forming the difference between said input and decoded signals includes a pair of resistors, the junction of the two resistors being connected to the input of said second comparator means, the other ends of said resistors being connected to electrical leads carrying said analog and decoded signals, and
said decoded signal is of the opposite polarity to said analog signal so that the signal formed at said junction by said pair of resistors is said difference.

16. The improvement of claim 15 including
means for combining said audible frequency component with said difference,
said means for combining including a means for amplifying having an input connected to said junction and its output connected to a mixer,
said mixer also receiving said analog input signal, and said bandpass filter being connected between the output of said mixer and said junction.

17. The improvement of claim 16 wherein said means for amplifying has a gain of three.

18. The improvement of claim 15 wherein said means for amplifying and said bandpass filter are connected in a loop originating at and terminating at said junction, and means for summing said analog signal with said difference signal, which is formed at said junction, are provided in said loop.

19. The improvement of claim 14 wherein said clock has a frequency of at least 15 times the high-frequency cutoff of said bandpass filter.

20. The improvement of claim 19 wherein said clock frequency is at least 225 K Hz.

* * * * *